(12) United States Patent
Piquette

(10) Patent No.: US 8,945,415 B2
(45) Date of Patent: Feb. 3, 2015

(54) METHOD FOR ETCHING A CERAMIC PHOSPHOR CONVERTER

(71) Applicant: Alan Piquette, Peabody, MA (US)

(72) Inventor: Alan Piquette, Peabody, MA (US)

(73) Assignee: OSRAM SYLVANIA Inc., Danvers, MA (US)

(*) Notice: Subject to any disclaimer, the term of this patent is extended or adjusted under 35 U.S.C. 154(b) by 0 days.

(21) Appl. No.: 13/918,412

(22) Filed: Jun. 14, 2013

(65) Prior Publication Data
US 2014/0001156 A1 Jan. 2, 2014

Related U.S. Application Data

(60) Provisional application No. 61/666,391, filed on Jun. 29, 2012.

(51) Int. Cl.
C03C 15/00 (2006.01)
C03C 25/68 (2006.01)
H01L 33/50 (2010.01)
C09K 11/00 (2006.01)

(52) U.S. Cl.
CPC .............. *H01L 33/508* (2013.01); *C09K 11/00* (2013.01)
USPC ............. 216/83; 216/100; 216/102; 216/103; 216/104; 216/105; 216/106; 216/107

(58) Field of Classification Search
None
See application file for complete search history.

(56) References Cited

U.S. PATENT DOCUMENTS

2009/0057698 A1* 3/2009 Okamura et al. ............... 257/98
2010/0147210 A1* 6/2010 D'Evelyn ....................... 117/81

* cited by examiner

*Primary Examiner* — Duy Deo
(74) *Attorney, Agent, or Firm* — Robert F. Clark

(57) ABSTRACT

A method is described for etching ceramic phosphor converters. The method includes contacting a surface of the converter with a solution of phosphor acid for a time sufficient to etch the converter. The method is applicable to ceramic phosphor converters comprising a phosphor having a general formula $M_xAl_yO_z$:RE wherein M is a metal and RE is a rare earth element.

5 Claims, 3 Drawing Sheets

METHOD FOR ETCHING A CERAMIC PHOSPHOR CONVERTER

CROSS REFERENCES TO RELATED APPLICATIONS

This application claims the benefit of U.S. Provisional Application No. 61/666,391, filed Jun. 29, 2012.

TECHNICAL FIELD

This invention is related to light emitting diodes (LEDs) and in particular LEDs that utilize solid ceramic phosphor converters.

BACKGROUND OF THE INVENTION

It is desirable in lighting applications that rely on the forward projection of light, e.g. automotive and information projection systems, to improve the starting etendue and directionality of the light source. It is also desirable to consider energy losses when designing any light source. One specific problem that arises in phosphor-conversion LEDs (pc-LEDs) that utilize flat, smooth-surfaced ceramic phosphor converter plates, particularly those that are highly transparent, is that beneficial forward light can be lost through unwanted side emission from the converter plate. In particular, light emitted at each point in the ceramic at angles larger than the Total Internal Reflection (TIR) critical angle has an increased probability to be lost to side emission or absorption. The enhanced side emission or absorption in the solid ceramic converters may lead to several problems in directional lighting systems employing such pc-LEDs, e.g., decreased optical efficiency, increased etendue or issues with color consistency.

SUMMARY OF THE INVENTION

Roughening (or texturing) the surface of a ceramic converter can increase the ratio of forward-to-side emitted light. This invention provides a method for etching ceramic phosphor converters so that more light can be emitted in a forward direction. In particular, the method of this invention uses phosphoric acid to etch the surface of solid ceramic phosphor converters comprising a phosphor with a general formula $M_xAl_yO_z$:RE wherein M is a metal and RE is a rare earth element. More preferably, the ceramic converter comprises a garnet phosphor having a general formula $M_3Al_5O_{12}$:Ce, wherein M is Lu, Tb or Y (e.g. $Lu_3Al_5O_{12}$:Ce, $Y_3Al_5O_{12}$:Ce, $Tb_3Al_5O_{12}$:Ce, $(Lu,Y)_3Al_5O_{12}$:Ce, $Y_3(Al,Ga)_5O_{12}$, or $Y_3(Al,Si)_5(O,N)_{12}$:Ce).

The primary advantage is that the invention provides a way to increase overall lumen output and significantly increase forward lumen output in flat ceramic converters at angles near normal to the surface. The surface of the ceramic is modified by etching into the grain structure. The etching can be controlled to some extent by altering time, temperature, and acid concentration. No special equipment is needed to texture the surfaces and the raw materials are relatively inexpensive.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

Figure 1:
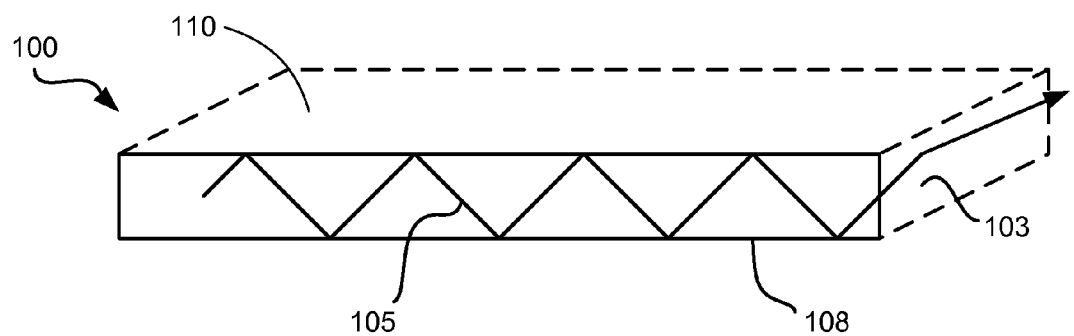
FIG. 1 is an illustration of a side view of a ceramic phosphor converter having a smooth primary light emitting surface.

In general, the refraction of light at the interface between two different substances is governed by Snell's Law. With reference to FIG. 1, a flat ceramic converter plate 100 is shown. In a phosphor conversion LED application, the converter 100 would be positioned such that its bottom surface 108 would face the LED and light emitted by the LED would enter the converter 100 through its bottom surface 108. In the embodiment shown in FIG. 1 the converter has a primary light emitting surface 110 which is substantially smooth. A light ray 105 within the converter is subject to TIR and may be reflected several times within the converter to be emitted out a side of the converter 103 rather than from the primary light emitting surface 110.

Figure 2:
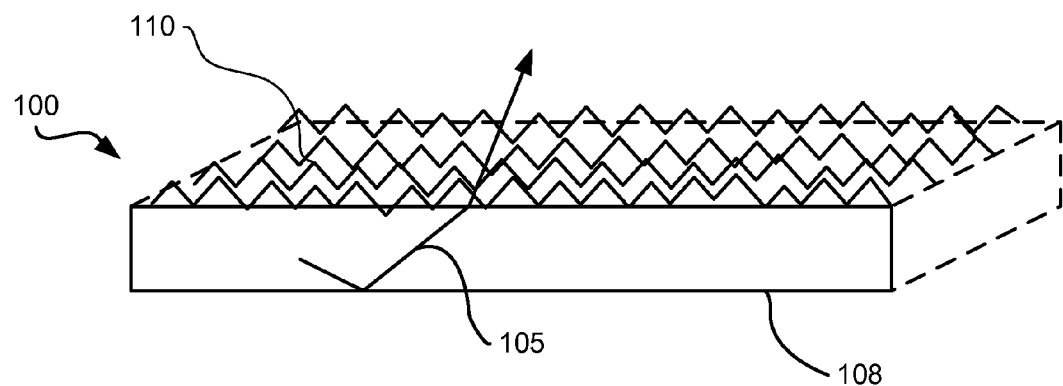
FIG. 2 is an illustration of a side view of a ceramic phosphor converter having a roughened primary light emitting surface.

To increase the amount of light that is emitted from the primary light emitting surface 110, the surface 110 may be roughened as shown in FIG. 2. The roughened surface of the ceramic converter creates many new interface angles, which in turn change the TIR conditions. According to the method of this invention, the surface 110 may be roughened by acid etching in which case the size and shape of the surface features are usually determined by the grain size of the ceramic. Larger grains typically result in larger surface features while smaller grains result in smaller features. As a result of the surface features, the light ray 105 has a greater probability of being emitted from the primary light emitting surface 110 as opposed to side emission as shown in FIG. 1. In a preferred embodiment, both the primary light emitting surface 110 and the bottom surface 108 of the converter are etched.

The thin, flat ceramic converter may be made by a conventional ceramic forming process, e.g., injection molding, pressing, tape casting, or extrusion. The converter is fired at a high temperature to sinter the phosphor particles together to form a solid ceramic piece. For example, powders of cerium-activated yttrium aluminum garnet, $Y_3Al_5O_{12}$:Ce (hereinafter YAG:Ce), or lutetium aluminum garnet, $Lu_3Al_5O_{12}$:Ce (hereinafter LuAG:Ce) can be mixed with a binder material, formed into the desired shape and sintered to form a solid ceramic converter of YAG:Ce or LuAG:Ce. The size of the ceramic converter can vary, but typical dimensions would be lengths and widths on the order of millimeters and depths on the order of 100 micrometers.

In one embodiment, the converter is immersed in a solution of hot, preferably boiling, phosphoric acid in order to roughen the surface of the ceramic converter. The etching time, acid temperature and concentration can be varied to produce the desired amount of surface roughening. The converter is then removed from the acid solution and washed cleaned by rinsing with water.

In another embodiment, the phosphoric acid may be mixed with sulfuric acid. Preferably the mixture of sulfuric ($H_2SO_4$)

and phosphoric ($H_3PO_4$) acids has a proportion in the range between 1:1 and 3:1 sulfuric to phosphoric acid.

Figure 3:
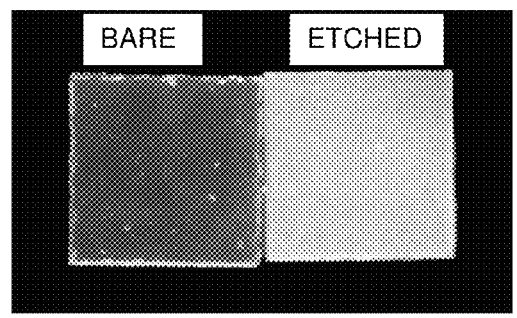
FIG. 3 is a photograph comparing bare and etched ceramic phosphor converters.
Figure 4:
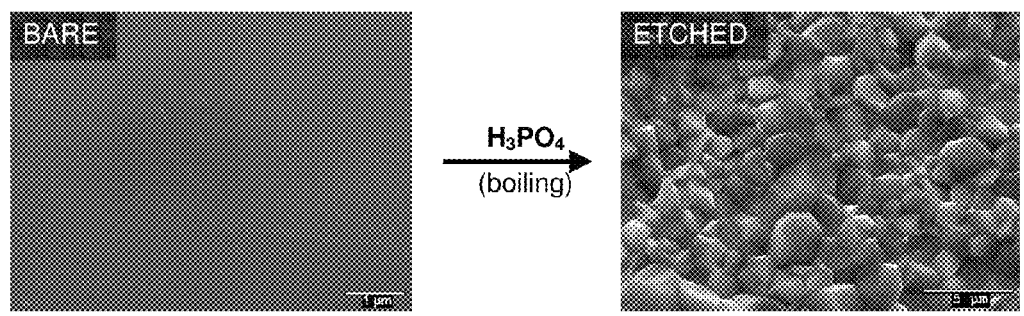
FIG. 4 shows photomicrographs of the surface of a ceramic phosphor converter before and after etching with phosphoric acid.

When a solution of 85% acid is used, the desired amount of etching usually occurs within tens of seconds to a few minutes. The ceramic is removed from the boiling acid and then rinsed with water and dried. FIG. 3 is a picture showing what happens when a smooth ceramic converter with high inline transmission is etched according to the invention. In this case, a YAG:Ce ceramic converter is shown before and after etching with hot $H_3PO_4$. The surface texturing causes the material to become opaque. Electron microscopy images of the bare and etched ceramic converters that are shown in FIG. 3 are shown in FIG. 4.

Photometry measurements were made that compare a bare YAG:Ce ceramic converter to the same converter after going through the acid etching procedure. Briefly, the textured surface increases the overall amount of light emitted from the ceramic converter. Perhaps more importantly, the roughened surface texture significantly changes the pattern of light emission; much more light is emitted normal to the primary light emitting surface.

Figure 5:
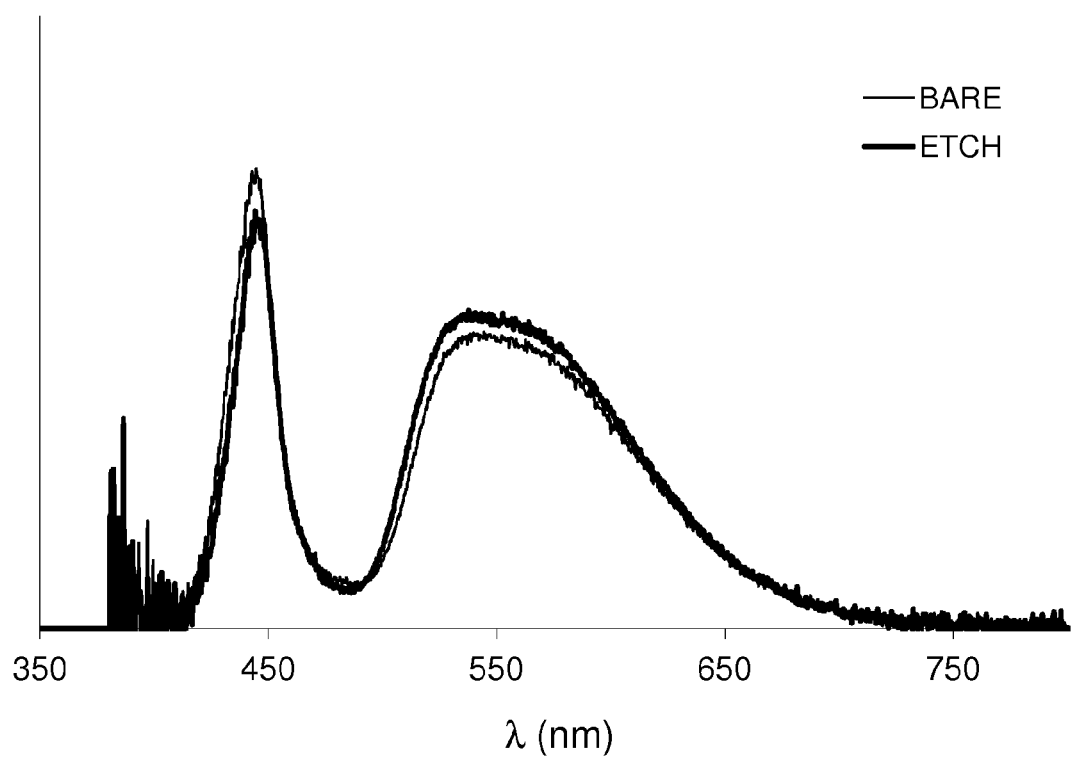
FIG. 5 compares the spectra generated by bare and etched ceramic phosphor converters when excited by a blue-emitting LED.

In particular, FIG. 5 shows that more yellow light from the converter is emitted when the surface has been etched. This is supported by the measurements provided in Tables 1-4 which compare the photometry results of the "bare" and "etched" converters.

TABLE 1

|  | BARE | ETCH | ETCH/BARE |
|---|---|---|---|
| LPW | 201.0 | 261.2 | 1.08 |
| Power | 0.1538 | 0.1566 | 1.02 |
| Photons ($\times 10^{16}$) | 4.17 | 4.28 | 1.03 |
| Cx | 0.3251 | 0.3341 | 1.03 |
| Cy | 0.3561 | 0.3810 | 1.07 |

In Table 2, the lumens per blue optical watt versus angle for a bare converter and that same converter after acid etching. The table shows the percentage gain/loss at four different angles. Table 3 shows the total photons detected versus angle for a bare converter and that same converter after acid etching at four different angles.

TABLE 2

| Angle | BARE | ETCH | ETCH/BARE |
|---|---|---|---|
| 0 | 147.7 | 181.2 | 1.23 |
| 30 | 159.4 | 181.4 | 1.14 |
| 60 | 150.3 | 149.8 | 1.00 |
| 80 | 33.6 | 26.2 | 0.78 |

TABLE 3

| Angle | BARE | ETCH | ETCH/BARE |
|---|---|---|---|
| 0 | $4.16 \times 10^6$ | $4.88 \times 10^6$ | 1.17 |
| 30 | $4.16 \times 10^6$ | $4.54 \times 10^6$ | 1.09 |
| 60 | $3.41 \times 10^6$ | $3.30 \times 10^6$ | 0.97 |
| 80 | $6.35 \times 10^5$ | $5.06 \times 10^5$ | 0.80 |

In Table 4, the $C_x$ chromaticity values versus angle are compared for a bare converter and that same converter after acid etching. It is worth noting that the change in Cx with angle, $\Delta C_x$, is almost the same at 60° from normal for the bare and etched converters (0.055 and 0.056 respectively).

TABLE 4

| Angle | BARE | ETCH | ETCH/BARE |
|---|---|---|---|
| 0 | 0.2914 | 0.2972 | 1.020 |
| 30 | 0.3082 | 0.3157 | 1.024 |
| 60 | 0.3463 | 0.3532 | 1.020 |
| 80 | 0.3896 | 0.3887 | 0.998 |

While there have been shown and described what are at present considered to be preferred embodiments of the invention, it will be apparent to those skilled in the art that various changes and modifications can be made herein without departing from the scope of the invention as defined by the appended claims.

I claim:

1. A method for etching a ceramic phosphor converter comprising:
 placing a surface of the ceramic phosphor converter in contact with a phosphoric acid solution for a time sufficient to etch the surface of the converter, the ceramic phosphor converter being selected from $Lu_3Al_5O_{12}$:Ce, $Y_3Al_5O_{12}$:Ce, $Tb_3Al_5O_{12}$:Ce, $(Lu,Y)_3Al_5O_{12}$:Ce, $Y_3(Al,Ga)_5O_{12}$, or $Y_3(Al,Si)_5(O, N)_{12}$:Ce.

2. The method of claim 1 wherein the ceramic phosphor converter is selected from $Lu_3Al_5O_{12}$:Ce, $Y_3Al_5O_{12}$:Ce, $Tb_3Al_5O_{12}$:Ce, $(Lu,Y)_3Al_5O_{12}$:Ce, $Y_3(Al,Ga)_5O_{12}$, or $Y_3(Al,Si)_5(O,N)_{12}$:Ce.

3. The method of claim 1 wherein the phosphoric acid solution contains sulfuric acid.

4. The method of claim 3 wherein a ratio of sulfuric acid to phosphoric acid in the phosphoric acid solution is in a range between 1:1 to 3:1.

5. The method of claim 1 wherein the phosphoric acid solution is boiling.

* * * * *